United States Patent
Bulgrin et al.

(10) Patent No.: US 11,861,270 B2
(45) Date of Patent: Jan. 2, 2024

(54) VIRTUAL THROAT INSPECTION

(71) Applicant: Rolls-Royce Corporation, Indianapolis, IN (US)

(72) Inventors: Charles Alan Bulgrin, Plainfield, IN (US); Bradley W. Burkett, Avon, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 794 days.

(21) Appl. No.: 16/860,368

(22) Filed: Apr. 28, 2020

(65) Prior Publication Data

US 2021/0334427 A1  Oct. 28, 2021

(51) Int. Cl.
*G06F 30/15* (2020.01)
*G06T 19/20* (2011.01)
*G06F 30/20* (2020.01)

(52) U.S. Cl.
CPC .............. *G06F 30/15* (2020.01); *G06F 30/20* (2020.01); *G06T 19/20* (2013.01)

(58) Field of Classification Search
CPC .......... G06F 30/15; G06F 30/20; G06F 30/25; G06F 30/27; G06F 30/28; G06T 19/20
See application file for complete search history.

(56) References Cited

U.S. PATENT DOCUMENTS

| | | |
|---|---|---|
| 2014/0142889 A1 | 5/2014 | Chuong |
| 2016/0162604 A1 | 6/2016 | Xiaoli et al. |
| 2017/0249783 A1 | 8/2017 | Mach Shepherd et al. |
| 2020/0184124 A1* | 6/2020 | Machalica ............... G06F 30/15 |

FOREIGN PATENT DOCUMENTS

| | | | | |
|---|---|---|---|---|
| EP | 3203032 A1 * | 8/2017 | ............ | F01D 9/041 |
| WO | WO-2005059313 A2 * | 6/2005 | ........... | F01D 17/165 |

OTHER PUBLICATIONS

Scharfenstein, Jens, et al. "Probabilistic CFD analysis of high pressure turbine blades considering real geometric effects." Turbo Expo: Power for Land, Sea, and Air. vol. 55232. American Society of Mechanical Engineers, 2013. (Year: 2013).*
Ligrani, Phil, Geoffrey Potts, and Arshia Fatemi. "Endwall aerodynamic losses from turbine components within gas turbine engines." Propulsion and Power Research 6.1 (2017): 1-14. (Year: 2017).*

* cited by examiner

*Primary Examiner* — Michael Edward Cocchi
(74) *Attorney, Agent, or Firm* — Crowell & Moring LLP

(57) ABSTRACT

An improved manufacturing method includes virtually aligning scanned virtual vane components that are virtual electronic counterparts of separately manufactured and three-dimensionally scanned physical vane components used in gas turbine engines. The improved method performs virtual alignments for any of various possible virtual combinations of the virtual vane components to predict how their physical counterparts would likely behave in combination with each other before those physical counterparts are inseparably combined. One or more optimal virtual combinations are identified, in turn indicating optimal physical combinations to select to form physical vanes incorporated into one or more gas turbine engines, in turn improving the quality of the vanes and ultimately engine performance.

19 Claims, 8 Drawing Sheets

VIRTUAL THROAT INSPECTION

TECHNICAL FIELD

This disclosure relates to gas turbine engines and, in particular, to engine manufacturing processes incorporating virtual analysis of nozzle guide vanes.

BACKGROUND

Turbine sections of gas turbine engines include multiple stages of vanes. The structure of a vane defines a throat area through which air flow passes. The throat area affects the flow rate of the air flow, which in turn has significant impact on engine performance. Accordingly, actual throat area that deviates too far away from an ideal or designed-for throat can have detrimental impact on engine performance.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
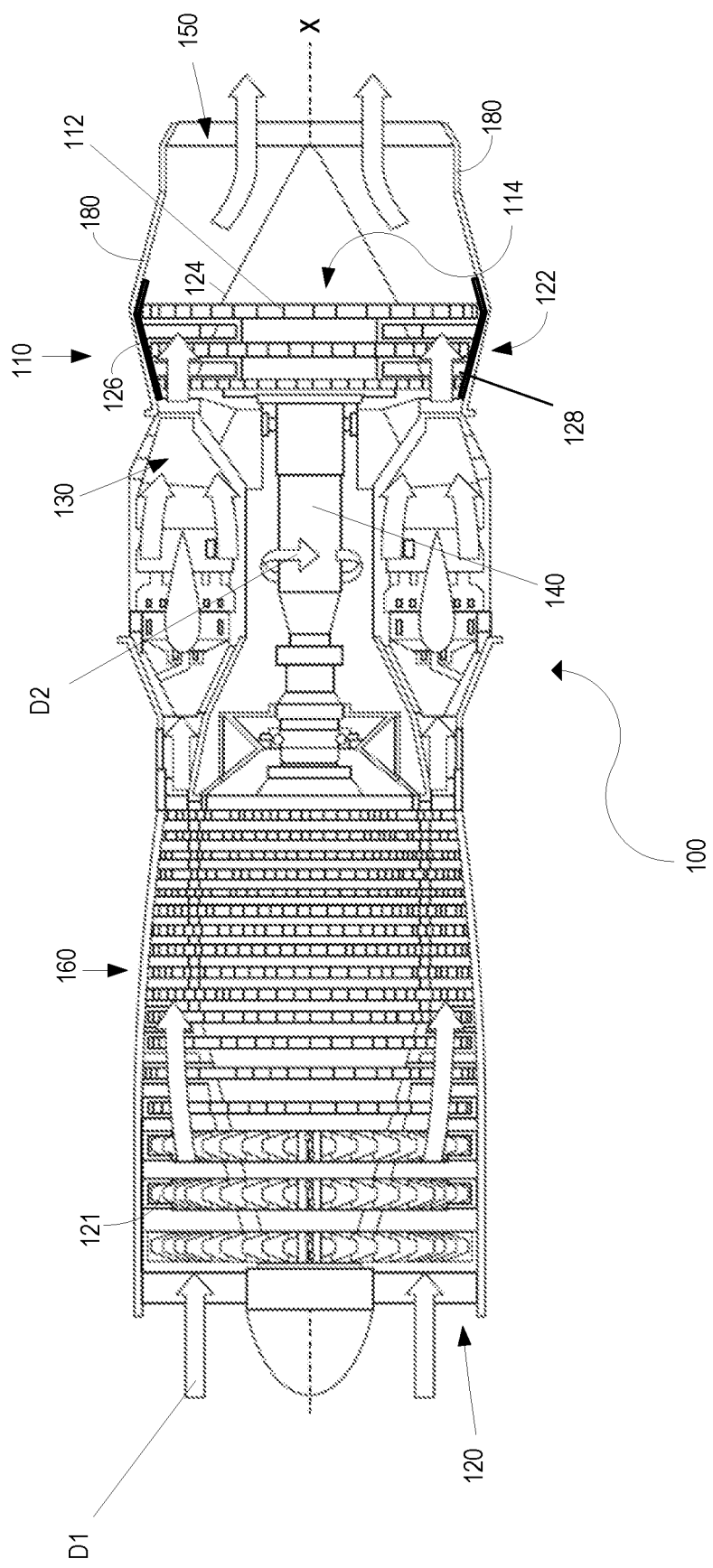
FIG. 1 is a cross-sectional view of a gas turbine engine.

By way of an introductory example, as turbine engine manufacturing method includes: identifying, with a controller, a plurality of virtual combinations of a plurality of scanned virtual vane components, each scanned virtual vane component comprising a respective first data set that indicates a three-dimensional virtual representation of a different one of a plurality of physical vane components manufactured and three-dimensionally scanned to generate the scanned virtual vane components; determining, with the controller, a plurality of virtual throat areas for the plurality of virtual combinations, wherein determining the plurality of virtual throat areas comprises, for each combination: virtually aligning, with the controller, mating surfaces of scanned virtual vane components of a respective virtual combination; in response to the virtually aligning, determining, with the controller, an aligned virtual vane corresponding to the respective virtual combination, the aligned virtual vane comprising a second data set indicating a three-dimensional virtual representation of a different one of a plurality of physical combinations of the physical vane components; and calculating, with the controller, a respective virtual throat area of the aligned virtual vane; selecting a physical combination of physical vane components of the plurality of physical vane components, the selection dependent on an optimal virtual combination having an optimal virtual throat area from among the plurality of virtual throat areas, wherein the physical combination corresponds to the optimal virtual combination; and assembling together physical vane components of the selected physical combination to form a vane of a gas turbine engine having an optimal physical throat area.

An interesting feature of the systems and methods described below may be that the various ways that various physical vane components interact or combine with each other can be predicted before certain combinations are selected to form inseparable, physical vanes.

Another interesting feature of the systems and methods described below may be that vane assembly processes are improved since they will produce, at least on average, physical vanes with actual throat areas closer to a nominal throat area.

Another interesting feature of the systems and method described below is that engine performance will be improved since, on average, the engines will have vanes with throat areas closer to a nominal throat area.

Another interesting feature of the systems and methods described below is that vane assembly processes will have reduced numbers of vanes needing to be discarded, such as ones manufactured out of specification due to arbitrary selection of vane components for assembly.

Another interesting feature is that combinations of physical vane components can be intelligently, rather than arbitrarily selected, leading to, on average, improved vanes.

Another interesting feature of the systems and methods described below may be that among numerous possible combinations of physical vane components available to a manufacturer, only those best combinations can be identified and selected to form the inseparable, physical vanes.

Another interesting feature of the systems and methods described below is that an initial virtual analysis can be used to filter out certain combinations of vane components for a subsequent virtual analysis that identifies physical combinations of vane components to use to form vanes.

Another interesting feature of the systems and methods described below is that an initial virtual analysis of an initial set of virtual combinations of vane components can be used to identify better virtual combinations by mix-and-matching virtual components from different combinations in the initial set.

Another interesting feature of the systems and methods described below is that electronically stored data, such as scan mesh data, that three-dimensionally virtually represents actual manufactured individual vane components can be analyzed in combination with each other, rather than individually, to assess the behavior and interaction of their physical counterparts in combination before those physical counterparts are inseparably combined together to form the vanes.

Another interesting feature of the systems and methods described below is that computers can be incorporated into a manufacturing process to perform virtual throat area calculations of virtual combinations of vane components before their physical counterparts are inseparably combined, calculations that cannot be performed on the physical counterparts themselves before the physical counterparts are inseparably combined.

Another interesting feature of the systems and methods described below is that computers are incorporated into a manufacturing process to analyze virtual representations of actually manufactured physical structures that are three-dimensionally complex, whose combined behavior and interconnection, due to imperfections of the manufacturing processes and three-dimensional complexities of the parts, cannot be accurately predicted, and therefore can only be accurately assessed until after the physical structures are inseparably combined together to form a single vane structure.

These and other interesting features are described in further detail with reference to various embodiments described below and the attached drawings.

FIG. 1 is a cross-sectional view of a gas turbine engine 100. In some examples, the gas turbine engine 100 may supply power to and/or provide propulsion of an aircraft. Examples of the aircraft may include a helicopter, an airplane, an unmanned space vehicle, a fixed wing vehicle, a variable wing vehicle, a rotary wing vehicle, an unmanned combat aerial vehicle, a tailless aircraft, a hover craft, and any other airborne and/or extraterrestrial (spacecraft) vehicle. Alternatively or in addition, the gas turbine engine 100 may be utilized in a configuration unrelated to an aircraft such as, for example, an industrial application, an energy application, a power plant, a pumping set, a marine application (for example, for naval propulsion), a weapon system, a security system, a perimeter defense or security system.

The gas turbine engine 100 may take a variety of forms in various embodiments. Though depicted as an axial flow engine, in some forms the gas turbine engine 100 may have multiple spools and/or may be a centrifugal or mixed centrifugal/axial flow engine. In some forms, the gas turbine engine 100 may be a turboprop, a turbofan, or a turboshaft engine. Furthermore, the gas turbine engine 100 may be an adaptive cycle and/or variable cycle engine. Other variations are also contemplated.

The gas turbine engine 100 may include an intake section 120, a compressor section 160, a combustion section 130, a turbine section 110, and an exhaust section 150. During operation of the gas turbine engine 100, a main fluid received from the intake section 120, such as air, travels through a main fluid flow path in a main fluid flow path direction D1 through blades 121 in the intake section 120. As shown in FIG. 1, the main fluid flow path direction D1 is generally parallel with a centerline X of the engine 100. The fluid may be compressed within the compressor section 160. The compressed fluid may then be mixed with fuel and the mixture may be burned in the combustion section 130. The combustion section 130 may include any suitable fuel injection and combustion mechanisms. The hot, high pressure fluid may then pass through the turbine section 110 to extract energy from the fluid and cause a turbine shaft of a turbine 114 in the turbine section 110 to rotate, which in turn drives the compressor section 160. Discharge fluid may exit the exhaust section 150.

As noted previously, the hot, high pressure fluid passes through the turbine section 110 during operation of the gas turbine engine 100. As the fluid flows through the turbine section 110, the fluid passes between adjacent turbine blades 112 of the turbine 114 causing the turbine 114 to rotate. The rotating turbine 114 may turn a shaft 140 in a rotational direction D2, for example. The turbine blades 112 may rotate around an axis of rotation, which may correspond to a centerline X of the turbine 114 in some examples.

The turbine blades 112 may be distributed in an array of blades 122 circumferentially spaced around a hub 124 (or core or turbine spool) of the turbine 114. Circumferentially surrounding the array of blades 122 is a blade track system 126. The blade track system 126 is designed to track outer edges or tips of turbine blades 112 included in the array of blades 122 as the blades 112 radially expand and contract, due to, for example, rotation of the hub 124 causing centrifugal force, and/or changes in temperature causing materials to expand and contract.

The turbine section 112 may also include one or more vane stages 128. A vane stage (also called a vane assembly) 128 is a component that directs the flow of fluid through at least a portion of the turbine section 112. Example types of a vane stage 128 include an inlet vane stage and an exhaust vane stage, although other types of vane stages may be possible. Also, as described in further detail below, a vane stage 12 includes a plurality of vanes (also called vane segments) connected together. Like a vane stage as a whole, each vane segment, or a combination of two or more vane segments, is configured to direct the flow of fluid through at least a portion of the turbine section 112.

Surrounding the blade track system 126 and the vane stage(s) 128 is a turbine casing 180. The blade track system 126 and the vane stage(s) 128 are positionable axially with the centerline X within the turbine casing 180 and radially outward of the turbine blades 112. The blade tracks may be dynamically radially moved outwardly and inwardly by the blade track system 126 in response to dynamic operation of the gas turbine engine 100 to avoid/control a rub of the tip of the turbine blades 112 on the segments of the blade tracks.

Figure 2:
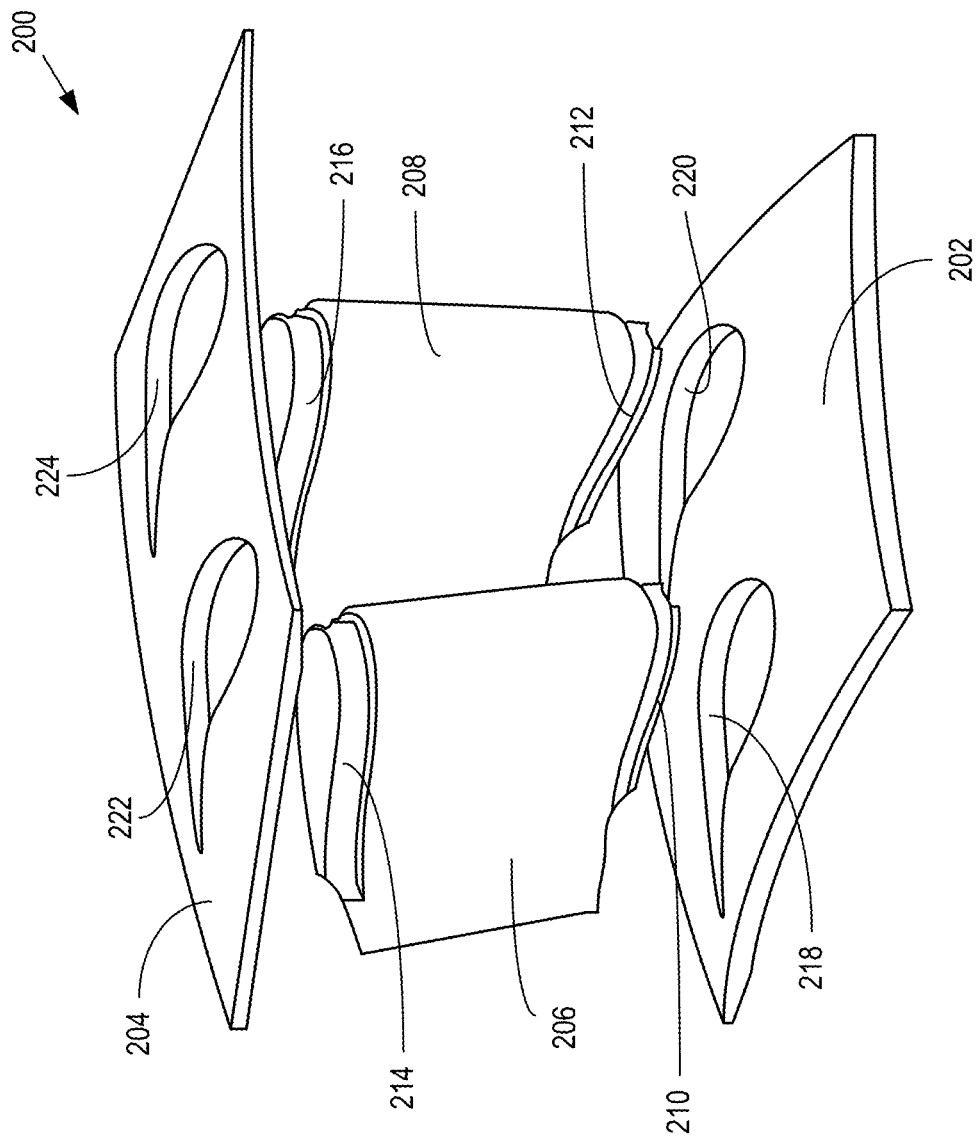
FIG. 2 is an exploded perspective view of an example vane of the gas turbine engine of FIG. 1.

FIG. 2 is an exploded perspective view of an example vane (or vane segment) 200. In various embodiments, including that shown, the vane 200 is a nozzle guide vane (NGV), such that a plurality of NGVs coupled together form within the engine 100 form an NGV stage or an NGV assembly, although other types of vanes, and/or names to refer to a vane, may be possible.

The vane 200 includes four separately manufactured (e.g., machined) components that are then combined—i.e., fixedly coupled or "locked"—together to form the vane 200. Each component of the vane 200 is of one of four vane component types, including an inner endwall type, an outer endwall type, a leading airfoil type, a trailing airfoil type. A vane component of a given type may be referred to by the name of the type. Accordingly, the components of a vane 200 includes an inner endwall 202, an outer endwall 204, a leading airfoil 206, and a trailing airfoil 208.

As illustrated in FIG. 2, the inner endwall 202 and the outer endwall 204 are each generally curved structures, such as shells, plates, or panels, that have curved contours, or radius of curvatures that generally track each other. When a predetermined number of vanes 200 are connected together, their combination forms a vane stage or assembly 128, which is a generally circular or cylindrical structure having the inner endwalls 202 connected together and the outer endwalls 204 connected together, such that the combination of inner endwalls 202 is concentric with the combination of outer endwalls 204. Additionally, when the vane 200 is positioned in the engine 100, the inner endwall 202 is the radially inward-most component of the vane 200, and accordingly positioned or disposed radially inward (e.g., closer to the centerline X of the engine 100 and/or a center of the vane stage 128) from the outer endwall 204. Also, when the vane 200 is positioned in the engine 100, the outer endwall 204 is the radially inward-most component of the vane 200, and accordingly position or disposed radially outward (e.g., farther from the centerline X of the engine 200 and/or a center of the vane stage 128) from the inner endwall 202.

Figure 4:
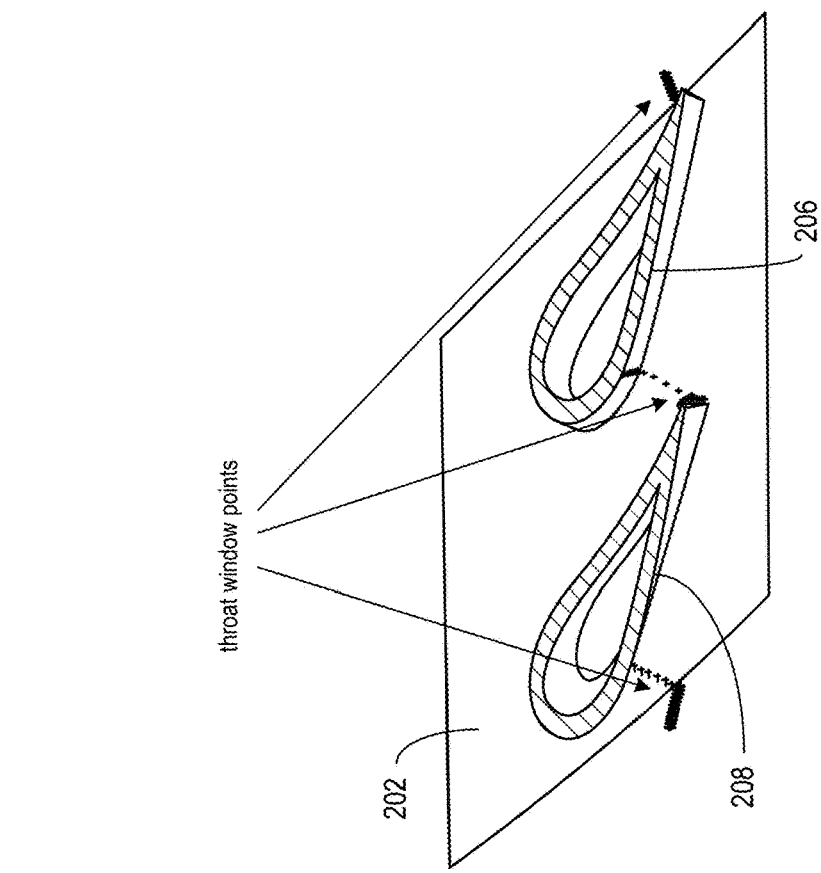
FIG. 4 is a cross-sectional top view of the example vane of FIG. 2, illustrating an inner endwall and inner ends of leading and trailing airfoils.
Figure 3:
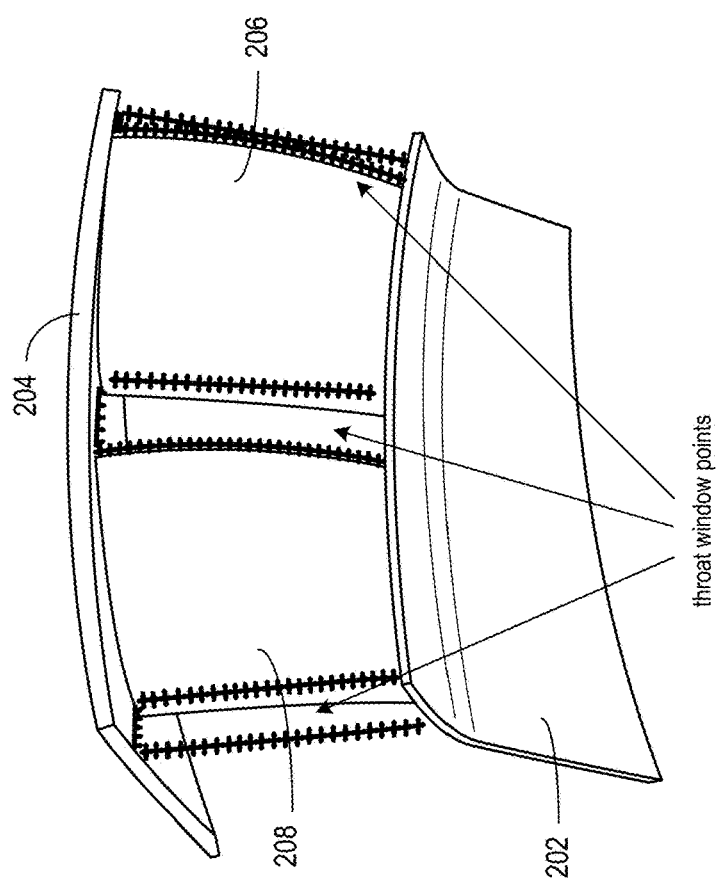
FIG. 3 is a rear side view of the example vane of FIG. 2.

The airfoils 206, 208 are radially extending structures that radially space apart the outer endwall 204 from the inner endwall 204. When combined, portions of surfaces of each of the inner endwall 202, the outer endwall 204, the leading airfoil 206 and the trailing airfoil 208, in combination, define, enclose, or otherwise provide a boundary for a three-dimensional volume or space, disposed between the inner and outer endwalls 202, 204 and between the leading and trailing airfoils 206, 208, through which fluid in the engine flows. As shown in FIGS. 3 and 4, certain predetermined points, called throat window points, along the surfaces of the four components 202-208 define a perimeter or boundary of a portion, called a throat window, of the space, and the area of the throat window, called a throat area and as defined by the throat window points, determines the flow rate of the air flow through the space of the vane 200. Accordingly, different amounts of the throat area can cause different flow rates.

Additionally, each of the vane components 202-208 includes a pair of mating surfaces. Each mating surface of a given vane component of a given vane is shaped to mate with, or contact, a corresponding mating surface of another vane component, in order for the vane components 202-208 to combine to form the vane 200. Specifically, each of the leading airfoil 206 and the trailing airfoil 208 includes a respective inner end having an inner mating surface 210, 212, and a respective outer end having an outer mating surface 214, 216. The inner mating surfaces 210, 212 are each shaped to mate with a respective one of a pair of mating surfaces 218, 220 of the inner endwall 202, and the outer mating surfaces 214, 216 are each shaped to mate with a respective one a pair of mating surfaces 222, 224 of the outer endwall 204.

Figure 5:
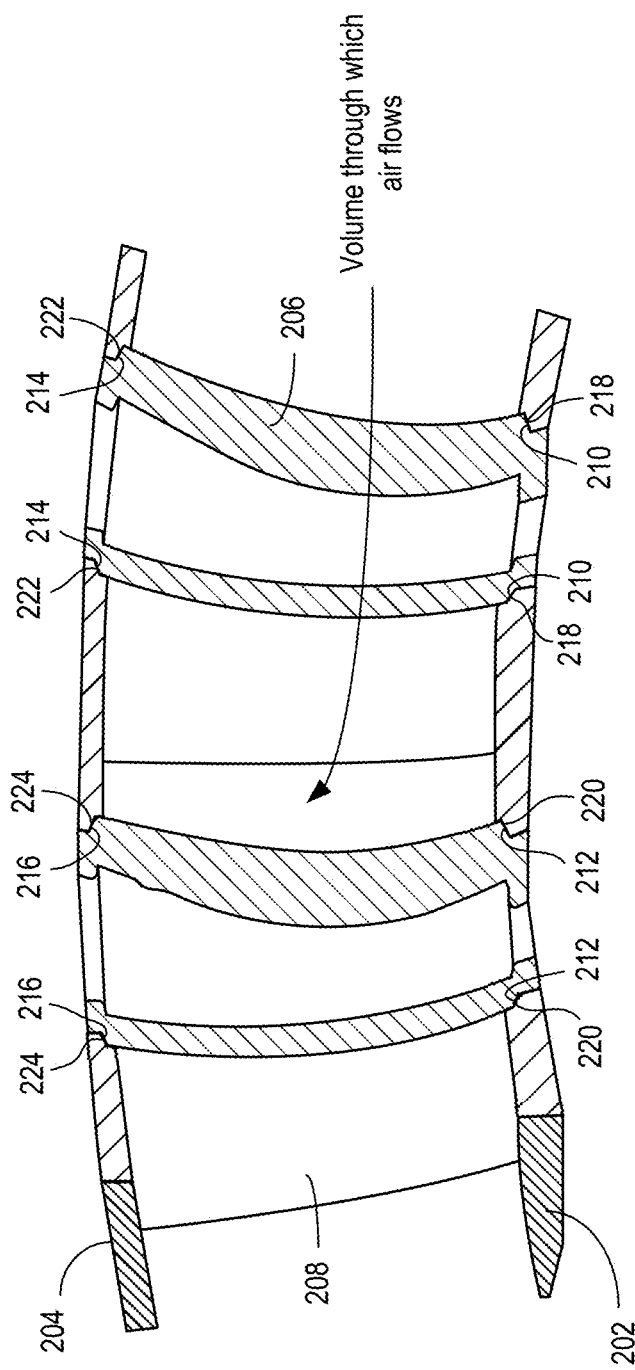
FIG. 5 is a cross-sectional rear side view of the example vane of FIG. 2.

As shown in FIGS. 2 and 5, the mating surface 218-224 are generally recessed relative to radially inward and outward facing curved surfaces of the inner or outer endwalls 202, 204. The inner and outer mating surfaces 210-216 of the airfoils 206, 208 may then project or extend into the recesses in order to mate with, or contact, their respective mating surfaces 218-224 of the endwalls 202, 204. For some embodiments, a given mating surface of a given vane component includes a conical surface. In addition or alternatively, for some embodiments, a given mating surface of a given vane component includes only a portion of a total surface that contacts a surface of another vane component when those vane components are combined together. For example, a mating surface of a given vane component may include only a conical surface portion of a surface that contacts a surface of another vane component.

Two vane components of the same vane component type may be generally manufactured according to the same manufacturing process according to the same drawing and/or specifications, and upon being manufactured, generally have the same physical structure, features, dimensions, and/or shape, except for imperfections due to non-idealities of the manufacturing process by which the components are manufactured. An imperfection may be a physical or geometrical feature or portion of the vane component that deviates from a perfect or nominal form of that vane component feature. An imperfection may be measurable and/or quantifiable, such that the imperfection has an associated quantified deviation that can be indicated in terms of units (such as thousands of an inch or microns as non-limiting examples) to indicate an amount of distance, area, or volume by which the imperfect feature deviates from the nominal feature, or in terms of a percentage that indicates a percent difference from the nominal value or that indicates a percentage of the nominal value (a percentage by which the imperfect feature is greater than or less than the nominal value).

Due to non-idealities of the manufacturing process, in the vast majority of situations, most vane components are imperfect (i.e., they have at least one imperfect feature), and rarely ever are two imperfect parts of the same vane component type the same (i.e., they have at least one imperfect feature that differs from each other, in terms of where the imperfection is located, how much it deviates from the nominal value, size, shape, etc.). Accordingly, in the vast majority of situations, no two imperfect vane components of the same vane component type are exactly the same. This non-matching between vane components of the same vane component type is exacerbated by the fact that each of the surfaces of the vane components are generally complex three-dimensional surfaces, having various combinations of differently shaped features, different curvatures, and extending differently in various directions, including three-dimensional (x-y-z) directions, and/or radial and axial directions, in turn augmenting the various ways in which two imperfect vane components of the same vane component type, made by the same manufacturing process according to the same drawings and/or specifications, can nonetheless dimensionally differ from each other.

In an ideal situation, each of the four vane components 202-208 that combine to form the vane 200 are manufactured perfectly. Such perfectly manufactured vane components 202-208, in turn have perfect mating surfaces 210-224, such that when they mate or contact each other, their mating is perfect—meaning that for each pair of mating surfaces that mate together, 100% of a given mating surface is in contact with the other mating surface with which it mates. When perfect or nominal vane components are combined together to form a perfect or nominal vane, such a nominal combination provides or determines a nominal throat area.

In reality, at least one, and most likely all four of the vane components 202-208 that combine to form a vane are manufactured imperfectly. When such is the case, the resulting imperfect vane may, and will most likely, determine an actual throat area that is different from the nominal throat area. Where an imperfect feature is located on a mating surface, the mating of the various mating surfaces 214-222 may contribute, at least in part, to the imperfect (or non-ideal) actual throat area.

Different mating surfaces with different imperfections may affect the amount by which the actual throat area deviates from the nominal threat area amount. For example, a vane component, due to its imperfection, may cause an increased throat area from the nominal value, or may cause a decreased throat area from the nominal value. Also, the amounts by which a throat area is caused to increase or decrease from the nominal value may differ for different vane components with different imperfections. For example, one vane component may cause a throat area to increase or decrease more than another vane component causes a throat area to increase or decrease.

Correspondingly, even with imperfect mating surfaces, certain combinations of vane components may yield a better throat area (one closer to its nominal value) than other combinations. For example, a vane component causing a throat area to increase and a vane component causing a throat area to decrease may, at least partially, offset their deviating effects, yielding an actual throat area that is closer to the nominal value, compared to two vane components that both cause a throat area to increase or both cause a throat area to decrease.

When manufacturing one vane or several vanes for a single engine, or for multiple engines, a manufacturer may have available several individual (e.g., separately machined) vane components, including several vane components for each vane component type. Such vane components may be individually stored or kept in any of various storage locations. To assemble a vane, a manufacturer may arbitrarily select one vane component from each of the four vane component types and combine them together to form the vane. The manufacturer may repeat this process of arbitrarily selecting vane components to make several vanes.

At the outset of a manufacturing process to manufacture one or more vanes, where several individual vane components are available to form the vanes, there exists many different possible combinations of those vane components to form the one or more vanes. As an example, in various embodiments, a given vane stage 128 includes twenty vanes, each including four vane components. Statistically, those eighty vane components provide 624,000 different possible combinations of four vane components (one inner endwall, one outer endwall, one leading airfoil, and one trailing airfoil) to form the twenty vanes.

Due to the various ways that different vane components can have different imperfections, the various possible combinations yield different possible throat area amounts. That is, among the various possible combinations, some combinations would yield better throat areas (closer to the nominal throat area) than others; one or more combinations would yield an M-number of optimal combinations having optimal throat areas (i.e., an M-number of throat areas closest to the nominal value) from among the various possible combinations; some possible combinations may yield non-optimal throat areas that are still within an acceptable range of throat areas (i.e., satisfies the specification); and some possible combinations may yield throat areas that are outside of an acceptable range of throat areas (i.e., outside the specification). For the latter case, if such a possible combination were actually manufactured, the resulting vane may be deemed unusable and discarded.

Due to the arbitrary selection process, and the extremely high number of possible combinations, selecting optimal combinations of vane components to form one or more vanes through the arbitrary selection is highly unlikely. Additionally, when the vane components are combined, they are fixedly coupled together to form a vane. Thereafter, a throat area of the vane is measured. If the throat area is determined to be less than optimal or outside an acceptable range, it is impractical, if not impossible, to disassemble the vane and form a new, reassembled vane with one or more new, replacement components, and determine if the reassembled vane provides a better throat area. The result then, is that during manufacturing, vanes are assembled that cannot be used, and/or vane stages are assembled that have less than optimal throat areas, in turn leading to engines that perform less than optimally due to the less than optimal air flow through the vane stages.

The present description describes improved vane manufacturing methods and/or gas turbine engine manufacturing methods that incorporate computing devices that perform virtual analysis of virtual three-dimensional representations of actual, physical vane components and determine which combinations of the physical vane components yield optimal throat areas. The manufacturing process can then intelligently select those combinations of physical vane components having optimal throat areas to form vanes included in a gas turbine engine. The result of the improved manufacturing methods is physical vanes and vane stages with better throat areas compared to if those vanes and vane stages were formed through arbitrary selection of the vane components.

Moreover, the computer portion of the improved manufacturing processes is not merely to utilize a computer to perform functions and calculations faster than a person would otherwise do in real life. Rather, the computing devices are used to analyze data sets indicating virtual combinations of virtual representations of the actual, physical components, and calculate virtual throat areas of those virtual combinations, before the actual, physical components are combined together. As mentioned, a manufacturer may manufacture the throat area of a physical vane after the vane components are fixedly combined together. That is, the manufacturer does not combine the vane components in some releasable manner, measure the throat area, and then solidify the combination only if the throat area is acceptable. In contrast, the computing device performs virtual analysis on virtual combinations of virtual components to provide accurate predictions of what actual throat areas would be for their physical counterparts before the corresponding physical vane components are assembled.

Figure 6:
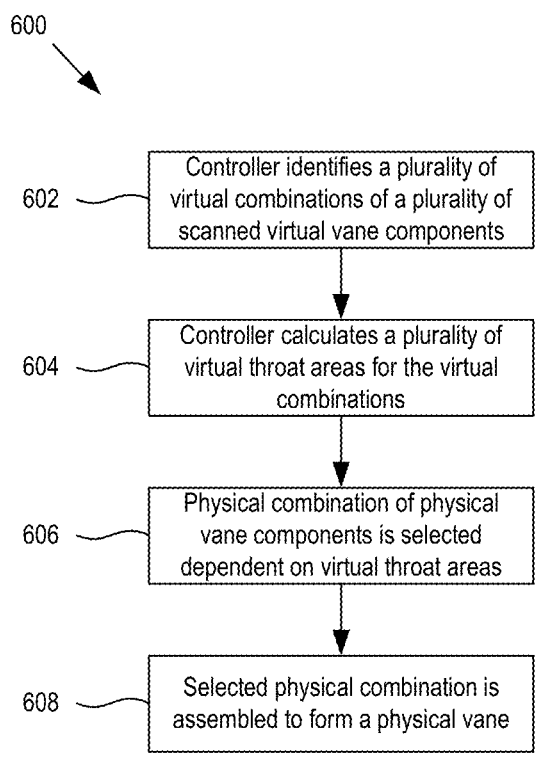
FIG. 6 is flow chart of an example method for manufacturing a vane.

FIG. 6 is a flow chart of an example manufacturing method 600 for manufacturing a vane that includes an inner vane, an outer vane, a leading airfoil, and an outer airfoil. A non-limiting example of such a vane is the vane 200 shown in FIGS. 2-5. In addition, as described in further detail below, certain actions or functions, including those functions performed on electronic data, are performed using a controller, which is generally an electronic device or circuit, implemented in hardware, or a combination of hardware and software, an example of which is described in further detail below with reference to FIG. 9.

At block 602, a controller may identify a plurality of virtual combinations of a plurality of scanned virtual vane components. As used herein, a virtual vane component is a data set, configured to be stored in a memory, that three-dimensionally and virtually represents a physical vane component. An example type of data set is a three-dimensional scan mesh. A virtual vane component may include a virtual inner endwall, a virtual outer endwall, a virtual leading airfoil, and a virtual trailing airfoil. Also, a data set of a virtual vane component may include a plurality of data points, where each data point indicates a portion of a virtual surface of the virtual representation of the physical component.

The controller may be configured to determine a virtual three-dimensional space (e.g., a virtual workspace) in which a virtual component can be virtually positioned. The controller can virtually move the virtual vane component around within the virtual workspace, such as in accordance with the six degrees of freedom associated with movement of an object. When a given virtual component is in a given virtual position in the virtual workspace, each of the data points of a data set of the given virtual component indicates a relative virtual position in the virtual workspace corresponding to the given virtual position. When the controller moves the virtual component to a different virtual position, the controller adjusts the relative virtual positions of each of the data points of the virtual component.

Also, a scanned virtual vane component is a virtual vane component that is generated as a result of a three-dimensional scanning process performed on an actual, physical vane component that was manufactured, such as by machining. An example three-dimensional scanning process may be a blue light three-dimensional scanning process, although other types of scanning processes, including other types of optical scanning processes, may be possible. Accordingly, after a physical vane component is manufactured, such as by machining, the physical vane component is three-dimensionally scanned to generate a virtual vane component that corresponds to the physical vane component. The virtual vane component that is generated may be stored in a memory that is part of the controller, or to which the controller otherwise has access. In this sense, a scanned virtual vane component uniquely corresponds to a particular physical vane component that is manufactured.

In addition, in various embodiments of a manufacturing process, a physical vane component that is manufactured may be assigned a unique identifier (ID), such as a serial number, that uniquely identifies the physical vane component. The ID may be formatted in any of various ways in order to uniquely identify the physical vane component from other physical vane components, including from physical vane components of the same vane component type. A virtual vane component that corresponds to a physical vane component may similarly be assigned the same unique ID as, or a unique ID corresponding to, the ID of the corresponding physical vane component. The controller may use the IDs of virtual vane components in order to select and identify certain vane components, and import them into the virtual workspace. Also, the controller may associate different data sets with a given virtual vane component ID. For example, the controller may be configured to identify several virtual positions of one virtual vane component within the virtual workspace. In turn, the controller may generate and store different data sets, each corresponding to a different position of the virtual vane component. The controller may associate these different data sets for one virtual vane component ID, in order to store and recognize the different positions of the virtual vane component.

Another type of virtual vane component is a nominal virtual vane component. A nominal virtual vane component is a data set that three-dimensionally virtually represents a perfect virtual vane component of a given vane component type. Accordingly, in various embodiments, the controller may be configured to recognize a nominal virtual inner endwall, a nominal outer endwall, a nominal leading airfoil, and a nominal trailing airfoil. Unlike a scanned virtual vane component, a nominal virtual vane component corresponds to a model according to which physical vane components are manufactured. The model may be virtually generated using computing technology. For example, the model may be a computer-aided design (CAD) drawing generated using CAD software.

Additionally, each nominal virtual vane component may have an associated predetermined virtual position within the virtual workspace. Accordingly, when the controller imports a given nominal virtual vane component into the virtual workspace, the controller positions the given nominal virtual vane component at its associated predetermined virtual position.

Each scanned virtual vane component corresponds to, or has an association with, a nominal virtual vane component of the same type. That is, scanned virtual inner endwalls correspond to, or are associated with, the nominal virtual inner endwall; scanned virtual outer endwalls correspond to, or are associated with, the nominal outer endwall; scanned virtual leading airfoils correspond to, or are associated with, the nominal virtual leading airfoil; and scanned virtual trailing airfoils correspond to, or are associated with, the nominal virtual trailing airfoil.

For a given physical vane component that is perfectly manufactured, the corresponding virtual vane component matches the corresponding nominal virtual vane component. Likewise, for a given physical vane component that is imperfectly manufactured, the corresponding virtual vane component differs from the corresponding nominal virtual vane component depending on the imperfections of the given physical vane component.

In addition to virtual vane components, the controller may identify virtual vanes. A virtual vane is a data set, configured to be stored in memory, that three-dimensionally virtually represents a physical vane. Similar to its physical counterpart, a virtual vane includes, or is a combination of, a virtual inner endwall, a virtual outer endwall, a virtual leading airfoil, and a virtual trailing airfoil. Like the individual virtual vane components, the controller may be configured to select a virtual vane or import a virtual vane into the virtual workspace. In the virtual workspace, the controller may virtually move the virtual vane around in any of various three-dimensional virtual positions. When a virtual vane is in a given virtual position within the virtual workspace at a given point in time, a data set of the virtual vane may indicate the given virtual position. Correspondingly, when the controller moves the virtual vane to a different virtual position in the virtual workspace, the controller modifies the data set to indicate the different virtual position. In various embodiments, the controller may store different sets associated with a single virtual vane in order to indicate different virtual positions of the single virtual vane.

Also, a virtual vane may be of one of two types, including a scanned virtual vane and a nominal virtual vane. A scanned virtual vane is a combination of scanned virtual vane components, including a combination of a scanned virtual inner endwall, a scanned virtual outer endwall, a scanned virtual leading airfoil, and a scanned virtual trailing airfoil. Two scanned virtual vanes may differ from each other by having at least one scanned virtual vane component of the same vane component type that is different from each other, such as by having different virtual vane component IDs. For example, two scanned virtual vanes are different from each other by respectively having different scanned virtual inner endwalls. As mentioned, the controller may identify two scanned virtual vane components of the same vane component type as being different from each other by identifying different IDs for the two scanned virtual vane components.

Additionally, a nominal virtual vane is a combination of nominal virtual vane components, including a combination of a nominal virtual inner endwall, a nominal virtual outer endwall, a nominal virtual leading airfoil, and a nominal trailing airfoil. In various embodiments, a nominal virtual vane has a predetermined virtual position within the virtual workspace. Accordingly, where the controller imports the nominal virtual vane into the virtual workspace, the controller virtually positions the nominal virtual vane at its predetermined virtual position in the virtual workspace.

As mentioned, at block 602, the controller identifies a plurality of virtual combinations of a plurality of scanned virtual vane components. One virtual combination of scanned virtual vane components is one scanned virtual vane. In various embodiments, at block 602, the plurality of scanned virtual vane components may be stored in memory, and the controller may access the memory to identify multiple, different virtual combinations of scanned virtual vane components that the plurality of scanned virtual vane components can form. In various embodiments, the number of virtual combinations may be all of the possible combinations that can be formed, or may be less than all of the possible combinations.

At block 604, the controller calculates a plurality of virtual throat areas, each for a respective one of the plurality of virtual combinations identified at block 602. Similar to how an actual throat area for a physical vane can be measured, the controller may be configured to identify those data points of a given virtual vane, formed from a given virtual combination, in a given virtual position in the virtual workspace, that form a set of virtual throat window points. Upon identifying the virtual throat window points of the data set, the controller may calculate a virtual throat area for the combination. In general, calculating a throat area using throat window points, actual or virtual, is known, and outside the scope of the present description.

As described in further detail below, at block 604, for each virtual combination, the controller may virtually align mating surfaces of the scanned virtual vane components of a respective combination in order to determine an aligned virtual vane corresponding to the virtual combination. Upon determining the aligned virtual vane, the controller may calculate a virtual throat area for the aligned virtual vane and the corresponding virtual combination.

At block 606, the manufacturing method 600 may transition to a physical selection process that selects a physical combination of physical vane components. The physical combination may include a physical inner endwall, a physical outer endwall, a physical leading airfoil, and a physical trailing airfoil. The physical combination is a subset of a plurality of physical vane components that were three-dimensionally scanned to generate the plurality of scanned virtual vane components for which the virtual combinations are determined at block 602. The selection performed at block 606 is dependent on the virtual throat areas calculated at block 604. In particular, the selection is dependent on an optimal virtual throat combination that has an optimal virtual throat area from among the plurality of virtual throat areas calculated at block 604. In various embodiments, an optimal virtual throat area may be one of an M-number (M being one or more) of best virtual throat areas among the plurality of virtual throat areas calculated at block 604. In general, the closer a calculated virtual throat area is to a predetermined nominal throat area value, the better the virtual throat area is. Accordingly, a best virtual throat area is one of an M-number of virtual throat areas, from among the plurality of virtual throat areas, closest to the nominal throat area value.

The selection performed at block 606 may be performed manually or through computer automation. For example, in various embodiments, the controller may be coupled to an electronic display that displays at least an M-number optimal virtual combinations having the M optimal virtual throat areas. The information that is displayed may indicate the physical vane components to select to form the physical combination—i.e, the physical vane. A person (or several persons) manually performing the selection process may analyze the display to determine the physical vane components to select. In other embodiments, an automated process may utilize a machine that is configured to identify, select, and grasp physical vane components from storage. The machine may electronically receive information identifying at least the M-number of optimal virtual combinations from the controller, and in response, select the physical vane components of the physical combination corresponding to one of the M-number of optimal virtual combinations.

At block 608, the physical vane components of the selected physical combination are assembled together to form a physical vane. As a result of the assembly at block 608, the physical vane has an optimal physical throat area that is better, or at least much more statistically likely to be better, than if blocks 602 and 604 were never performed and the physical vane components were instead arbitrarily selected at random.

At block 608, the physical vane components may be assembled or combined together in any of various ways. In general, the selected physical vane components may be moved to a tooling that loads the mating surfaces of the physical components against each other to being the physical vane components into contact with each other. Subsequently, a casting process may be performed that joins and locks together the physical vane components so that they become one single physical vane. Also, for at least some example embodiments, the actual throat area of the physical vane may be measured as part of an inspection process. Since the physical vane components were intelligently selected based on the virtual processes at blocks 602 and 604, then the actual throat area calculated at block 608 is much more likely to yield an optimal, or at least acceptable, value compared to if the physical vane components were just arbitrarily selected. Accordingly, through performance of the virtual processes at blocks 602 and 604, the likelihood that the physical vane produced at block 608 will have to be discarded due to having an unacceptable throat area is reduced, in turn leading to greater efficiency and cost savings.

Figure 7:
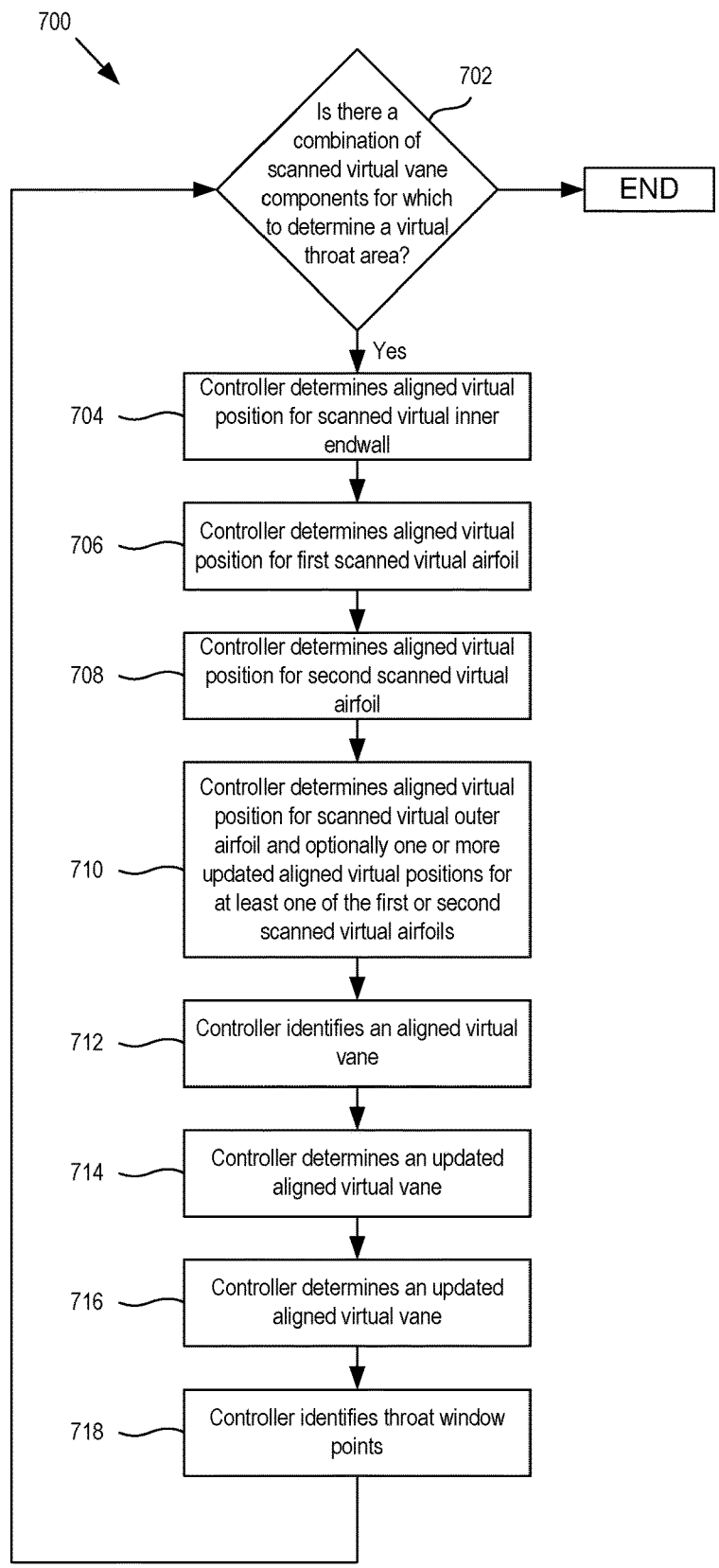
FIG. 7 is a flow chart of an example method of calculating virtual throat areas for a plurality of aligned virtual vanes.

As previously described, at block 604, in order for the controller to calculate the plurality of virtual throat areas, the controller may virtually align mating surfaces of the scanned virtual vane components of respective virtual combinations before calculating the virtual throat areas. FIG. 7 is a flow chart of an example virtual throat area calculation method 700, involving virtually aligning mating surfaces of scanned virtual vane components, that the controller may perform for block 604 in order to calculate the plurality of virtual throat areas.

At block 702, the controller may determine whether there are any virtual combinations for which to calculate a corresponding virtual throat area. As previously described, the controller may identify a plurality of virtual combinations of scanned virtual vane components, such as at block 602 in FIG. 6. In various embodiments, the controller may use the plurality of virtual combinations it identified at block 602 to make the determination at block 702. If the controller determines it has calculated virtual throat areas for all of the identified virtual combinations, then the controller determines that there are no further virtual throat area calculations to make, and the method 700 may end. Alternatively, at block 702, if the controller identifies a virtual combination for which to calculate a corresponding virtual throat area, then the method 700 may proceed to block 704.

As previously described, a given virtual combination that the controller identifies may have an associated scanned virtual inner endwall, a scanned virtual outer endwall, a scanned virtual leading airfoil, and a scanned virtual trailing airfoil. Accordingly, by identifying a given virtual combination, the controller is able to identify those scanned virtual vane components associated with the given virtual combination.

At block 704, the controller may determine an aligned virtual position in the virtual workspace for a scanned virtual inner endwall of the identified virtual combination. To do so, the controller may import the scanned virtual inner endwall into the virtual workspace, and perform an initial alignment to determine an initial virtual position for the scanned virtual inner endwall. Additionally, for at least some embodiments, after determining the initial virtual position, the controller then performs a secondary alignment that fine tunes the initial virtual position to arrive at the aligned virtual position for the scanned virtual inner endwall.

In various embodiments, the controller may align the scanned virtual inner endwall to the nominal virtual inner endwall to determine an initial virtual position. As previously described, the nominal virtual inner endwall may have an associated predetermined virtual position in the virtual workspace. Accordingly, when performing the initial alignment, the controller aligns the scanned virtual inner endwall to the nominal virtual inner endwall, with the nominal virtual inner endwall positioned at its predetermined virtual position.

Also, in various embodiments, the controller may execute a local best fit algorithm in order to align the scanned virtual inner endwall to the nominal virtual inner endwall. For at least some embodiments, the local best fit algorithm may be executed on all of the data points of the data sets of the scanned and nominal virtual inner endwalls.

In various embodiments, the secondary alignment is a six-point relative point system (RPS). When performing the RPS alignment, the controller identifies six points or datums of the nominal virtual inner endwall, and aligns the scanned virtual inner endwall to the six datums. The six datums may include three primary datums, two secondary datums, and one tertiary datum. The controller may identify one or more sequences associated with the datums in order to perform the RPS alignment. A given sequence identifies an order of primary, secondary, and tertiary datums to which the controller aligns the scanned virtual inner endwall. A first sequence indicates to the controller to align to the scanned virtual inner endwall to the primary datums first, to the secondary datums second, and to the tertiary datum last. A second sequence indicates to the controller to align to the scanned virtual inner endwall to the secondary datums first, to the tertiary datum second, and to the primary datums last. Other sequences are possible, and in general, the controller may position the primary, secondary, and tertiary datums in any order for a given sequence.

Accordingly, the controller may perform the RPS alignment in one or more iterations, with each iteration being performed according to a different sequence of datums. At the end of an iteration, the controller may determine an updated virtual position, updated from the initial virtual position, for the scanned virtual inner endwall. For at least some embodiments, the controller may perform a current iteration, and then condition whether to perform a next iteration on whether the current iteration has sufficiently aligned the scanned virtual inner endwall to the datums. If it has, then the controller may determine to end the RPS alignment. Alternatively, if the controller determines that the current iteration has not sufficiently aligned the scanned virtual inner endwall to the datums, then the controller may determine to perform a next iteration according to a different sequence of datums. In other embodiments, the controller may perform a predetermined number of iterations, each according to a different one of a plurality of sequences of datums. At the end of a last iteration, the controller may determine which iteration provided the best alignment. For any of the embodiments, at the end of last iteration, the controller determines a final virtual position of the scanned virtual inner endwall, which is one of the one or more updated virtual positions determined from the one or more iterations.

For at least some embodiments, the controller fixes or locks the virtual position of the scanned virtual endwall for a remaining portion of the alignment process. That is, the controller may align the rest of the scanned virtual leading airfoil, the scanned virtual trailing airfoil, and the scanned virtual outer endwall to the scanned virtual inner endwall by keeping the virtual position of the scanned virtual inner endwall fixed, and virtually moving the other scanned virtual components in order to properly align them to each other.

In further detail, at block 706, the controller may determine an aligned virtual position in the virtual workspace for a first scanned virtual airfoil of the identified virtual combination. The first scanned virtual airfoil may be the scanned virtual leading airfoil or the scanned virtual trailing airfoil. That is, as described further in connection with block 708, the controller aligns both the scanned virtual leading airfoil and the scanned virtual trailing airfoil to the scanned virtual inner endwall. In various embodiments, the controller may perform the alignment for the scanned virtual leading airfoil first and the scanned virtual trailing airfoil second. In other embodiments, the controller may perform the alignment for the scanned virtual trailing airfoil first and the scanned virtual leading airfoil second.

To determine an aligned virtual position for the first scanned virtual airfoil, the controller may import the first scanned virtual airfoil into the virtual workspace, and perform an initial alignment to determine an initial virtual position for the first scanned virtual airfoil. Additionally, for at least some embodiments, after determining the initial virtual position, the controller then performs a secondary alignment that fine tunes the initial virtual position to arrive at the aligned virtual position for the first scanned virtual airfoil.

To perform the initial alignment, the controller may align the first scanned virtual airfoil to a first nominal virtual airfoil to determine an initial virtual position. (If the first scanned virtual airfoil is the scanned virtual leading airfoil, then the first nominal virtual airfoil is the nominal virtual leading airfoil; and if the first scanned virtual airfoil is the scanned virtual trailing airfoil, then the first nominal virtual airfoil is the nominal virtual trailing airfoil). As previously described, the first nominal virtual airfoil may have an associated predetermined virtual position in the virtual workspace. Accordingly, when performing the initial alignment, the controller aligns the first scanned virtual airfoil to the first nominal virtual airfoil, with the first nominal virtual airfoil positioned at its predetermined virtual position.

Also, in various embodiments, the controller may execute a local best fit algorithm in order to align the first scanned virtual airfoil to the first nominal virtual airfoil. For at least some embodiments, the local best fit algorithm may be executed on all of the data points of the data sets of the first scanned and nominal virtual airfoils.

In the secondary alignment process, the controller aligns the inner mating surface of the first scanned virtual airfoil to a first mating surface of the scanned virtual inner endwall. To do so, the controller keeps the scanned virtual inner endwall fixed in its aligned virtual position, and adjusts the initial virtual position of the first scanned virtual airfoil to identify a local best fit between the two virtual mating surfaces.

In further detail, the controller highlights the inner mating surface of the first scanned virtual airfoil and the first mating surface of the scanned virtual airfoil for execution of a local best fit algorithm. For example, the controller identifies the data points of the data set of the first scanned virtual airfoil that represent or comprise the inner mating surface of the first scanned airfoil, and similarly, the controller identifies the data points of the data set of the scanned virtual inner endwall that represent or comprise the first mating surface of the scanned virtual inner endwall.

For at least some example embodiments, the controller may be configured to execute a projection function in order to identify the data points comprising the virtual mating surfaces. In the projection function, the controller identifies the data points that represent the inner mating surface of the first nominal virtual airfoil, and then projects those data points onto the first scanned virtual airfoil in order to determine those data points representing or comprising the inner mating surface of the first scanned virtual airfoil. Similarly, the controller identifies the data points that represent the first mating surface of the scanned virtual inner endwall, and projects those data points into the scanned virtual inner endwall in order to determine those data points representing or comprising the first mating surface of the scanned virtual inner endwall. Additionally, for at least some example embodiments, the projection may result in determining a number of data points for a mating surface of a given scanned virtual vane component that is less than all of the data points of the mating surface, depending on any imperfections of the physical mating surface of the corresponding physical vane component. Accordingly, the data points that the controller determines when performing the highlighting of a given mating surface may or may not be less than 100% of the data points representing or comprising the given mating surface, and that percentage may vary depending on the imperfections of the corresponding physical mating surface.

Upon highlighting the two virtual mating surfaces, the controller may align the inner mating surface of the first scanned virtual airfoil to the first mating surface of the scanned virtual inner endwall. To do so, the controller may execute a local best fit algorithm to determine a local best fit of the two virtual mating surfaces. By first highlighting the two virtual mating surfaces before performing the local best fit, the local best first algorithm is executed on the two virtual mating surfaces only, without the remaining portions of the first scanned virtual airfoil and the scanned virtual inner endwall.

In general, the controller may execute the local best fit algorithm in one or more iterations. During each iteration, the controller may virtually move the first scanned virtual airfoil a certain amount, such as in one or more of the six degrees of freedom, and calculate a percentage that the inner mating surface of the first scanned virtual airfoil is virtually contacting the first mating surface of the scanned virtual inner endwall.

Also, for at least some example embodiments, the controller executes the local best fit algorithm according to a movement constraint that limits how much the first scanned virtual airfoil can virtually move during each iteration. Without the movement constraint, the local best fit algorithm may determine an aligned virtual position for the first scanned virtual airfoil that corresponds to a physically impossible, or otherwise noncompliant position for the corresponding physical airfoil relative to the physical inner endwall. For particular embodiments, the movement constraint value is equal or corresponds to an upper bound or a lower bound value from a nominal value of a manufacturing tolerance range of one or more of the physical mating surfaces when manufacturing the physical vane components. For example, a general tolerance range may be a given nominal value X plus-or-minus Y. For such an example, the movement constraint may be Y. A particular value for Y and/or the movement constraint is 0.002 inches, although other movement constraint values may be possible.

Upon executing the local best algorithm for the two highlighted mating surfaces, the controller may determine an aligned virtual position of the first scanned virtual airfoil. In particular embodiments, the controller may store the aligned virtual position in memory.

At block 708, the controller may determine an aligned virtual position for a second scanned virtual airfoil, where the second virtual airfoil is the other of the scanned virtual leading airfoil and the scanned virtual trailing airfoil virtually aligned at block 706. In general, the controller may determine the aligned virtual position for the second scanned virtual airfoil in the same way it determines the aligned virtual position for the first scanned virtual airfoil at block 706. That is, the controller first aligns the second scanned virtual airfoil to a second nominal virtual airfoil in its predetermined virtual position to determine an initial virtual position for the second scanned virtual airfoil. Then, the controller highlights an inner mating surface of the second scanned virtual airfoil and a second mating surface of the scanned virtual inner endwall, and then executes a local best fit algorithm on the virtual mating surfaces, with a movement constraint for the second scanned virtual airfoil. In particular embodiments, the movement constraint for the best fit algorithm executed for the second scanned virtual airfoil is the same as the movement constraint for the best fit algorithm executed for the first scanned virtual airfoil at block 706. Upon executing the local best algorithm for the two highlighted mating surfaces, the controller may determine an aligned virtual position of the second scanned virtual airfoil. In particular embodiments, the controller may store the aligned virtual position in memory.

At block 710, the controller may determine an aligned virtual position in the virtual workspace for the scanned virtual outer endwall of the identified virtual combination. To do so, the controller may import the scanned virtual outer endwall into the virtual workspace. The controller may then perform an initial alignment to determine an initial virtual position for the scanned virtual outer endwall, and subsequently perform a secondary alignment that fine tunes the initial virtual position to arrive at the aligned virtual position for the scanned virtual outer endwall.

To perform the initial alignment, the controller may align the scanned virtual outer endwall to a nominal virtual outer endwall to determine an initial virtual position. As previously described, the nominal virtual outer endwall may have an associated predetermined virtual position in the virtual workspace. Accordingly, when performing the initial alignment, the controller aligns the scanned virtual outer endwall to the nominal virtual outer endwall, with the nominal virtual outer endwall positioned at its predetermined virtual position. Also, similar to the other initial alignments, the controller may execute a local best fit algorithm on the data set comprising the scanned virtual outer endwall and the data set comprising the nominal virtual outer endwall.

After determining the initial virtual position for the scanned virtual outer endwall, the controller then performs the secondary alignment to determine the aligned virtual position of the scanned virtual outer endwall, and, for at least some embodiments, to determine updated aligned virtual positions of the first scanned virtual airfoil and/or the second scanned virtual airfoil. To do so, the controller may virtually align first and second mating surface of the scanned virtual outer endwall with the outer mating surfaces of the first and second scanned virtual airfoils, respectively. Accordingly, at block 710, the secondary alignment may include two virtual alignments on two pairs of virtual mating surfaces, including a first pair that includes the outer mating surface of the first scanned virtual airfoil and the first mating surface of the scanned virtual outer endwall, and a second pair that includes the outer mating surface of the second scanned virtual airfoil and the second mating surface of the scanned virtual outer endwall.

Similar to the secondary alignments performed at blocks 706 and 708, the controller may highlight the two pairs of virtual mating surfaces, and execute a pair of local best fit algorithms on the two pairs, including a first local best fit algorithm of the highlighted data points of the outer mating surface of the first scanned virtual airfoil and the first mating surface of the scanned virtual outer endwall, and a second local best fit algorithm of the highlighted data points of the outer mating surface of the second scanned virtual airfoil and the second mating surface of the scanned virtual outer endwall.

The controller may be configured to perform the first and second local best fit algorithms in various ways to obtain the local best fits. For at least some embodiments, the controller may virtually move the scanned virtual outer endwall from its initial virtual position in at least one iteration of the first local best fit algorithm and/or at least one iteration of the second local best fit algorithm. In addition or alternatively, the controller may virtually move the first scanned virtual airfoil during at least one iteration of the first local best fit algorithm, and/or virtually move the second scanned virtual airfoil during at least one iteration of the second local best fit algorithm. In other words, during the first local best fit algorithm, the controller may virtually move the scanned virtual outer endwall, may virtually move the first scanned virtual airfoil, or a combination thereof; and during the second local best fit algorithm, the controller may virtually move the scanned virtual outer endwall, may virtually move the second scanned virtual airfoil, or a combination thereof.

For embodiments where the controller virtually moves the scanned virtual outer endwall during the first local best fit algorithm and/or then second local best fit algorithm, then upon completing the first and second local best fit algorithms, the controller may determine an aligned virtual positioned for the scanned virtual outer endwall, which may be the same as, or different from, the initial virtual position of the scanned virtual outer endwall. Also, the aligned virtual positions of the first and second scanned virtual endwalls determined at blocks 706 and 708 may be starting virtual positions for the scanned virtual airfoils when the controller performs the first and second local best fit algorithms, respectively. For embodiments where the controller virtually moves the first scanned virtual airfoil during the first local best fit algorithm, then upon completing the first local best fit algorithm, the controller may determine an updated aligned virtual position for the first scanned virtual airfoil, which may be the same as, or different from, the aligned virtual position for the first scanned virtual airfoil determined at block 706. Similarly, for embodiments where the controller virtually moves the second scanned virtual airfoil during the second local best fit algorithm, then upon completing the second local best fit algorithm, the controller may determine an updated aligned virtual position for the second scanned virtual airfoil, which may be the same as, or different from, the aligned virtual position for the second scanned virtual airfoil determined at block 708.

Also, for at least some embodiments of block 710, the controller performs the first and second local best fit algorithms sequentially. That is, the controller performs the entirety of the first local best fit algorithm first, and then performs the entirety of the second local best fit algorithm; or performs the entirety of the second local best fit algorithm first, and then performs the entirety of the first local best fit algorithm. In other embodiments, the controller interleaves the iterations of the first and second local best fit algorithms together. For example, the controller may perform one or more iterations of one of the local best fit algorithms, then perform one or more iterations of the other local best fit algorithm, then move back to the initial local best fit algorithm, and so on. For any of the various embodiments, if the controller moves the scanned virtual outer endwall to a new virtual position during a given iteration of one of the local best fit algorithms, the controller may use that new virtual position when performing an initial or next iteration of the other local best fit algorithm.

In addition, for at least some example embodiments of block 710, in addition to virtually aligning the first pair of mating surfaces together, and the second pair of mating surfaces together, the controller may also perform additional virtual alignments on the inner mating surfaces of the first and second scanned virtual airfoils with the first and second mating surfaces of scanned virtual inner endwall. Accordingly, the controller may highlight a third pair of mating surfaces including the inner mating surface of the first scanned virtual airfoil and the first mating surface of the scanned virtual inner endwall, and perform a third local best fit algorithm on the third pair of mating surfaces; and/or may highlight a fourth pair of mating surfaces including the inner mating surface of the second scanned virtual airfoil and the second mating surface of the scanned virtual inner endwall, and perform a fourth local best fit algorithm on the fourth pair of mating surfaces. In various embodiments, the controller may perform the first, second, third, and/or fourth local best fit algorithms sequentially. In other embodiments, the controller may interleave one or more iterations of the various local best fit algorithms.

Also, in various embodiments, similar to the local best fit algorithms performed at blocks 706 and 708, the controller may perform the first, second, third, and/or fourth local best fit algorithms at block 710 according to one or more movement constraints that limits the virtual movement of the first scanned virtual airfoil, the second scanned virtual airfoil, and/or the scanned virtual outer endwall to within a certain amount in any of the various six-degrees of freedom. In particular embodiments, the movement constraint used at block 710 is larger than the movement constraint used at block 706 and/or block 708. In various of these embodiments, the movement constraint used at block 710 is in a range of about 1.5 to 2.5 times larger than the movement constraint used at block 706 and/or at block 708. In particular embodiments, the movement constraint is two times the movement constraint used at block 706 and/or at block 708. In addition or alternatively, the movement constraint used at block 710 depends on a tolerance range associated with manufacturing the physical mating surfaces corresponding to the virtual mating surfaces. For example, the movement constraint used at block 710 is equal to a difference between an upper bound and the lower bound of the tolerance range (or a size of the tolerance window defined by the upper and lower bounds), where such difference (or window size) is greater than the difference between the upper bound and the nominal value, or between the lower bound and the nominal value. In one particular non-limiting example, the movement constraints used at blocks 706 and 708 is 0.002 inches, equal to the absolute value of the difference between the upper bound of the tolerance range and the nominal value or between the lower bound of the tolerance range and the nominal value; and the movement constraint used at block 710 is 0.004 inches, equal to the difference between the upper and lower bounds.

Upon completing the first and second local best fit algorithms at block 710, with or without having performed the third and/or fourth local best fit algorithms, the controller may determine an aligned virtual position of the scanned virtual outer endwall, and for at least some embodiments, may also determine an updated aligned virtual position of the first scanned virtual airfoil and/or an updated aligned virtual position of the second scanned virtual airfoil.

Upon completing the virtual alignment at block 710, at block 712, the controller may identify an aligned virtual vane for the identified virtual combination, which is a combination of the four virtual vane components virtually positioned at their respective final aligned virtual positions determined at the end of block 710. Accordingly, the aligned virtual vane that the controller determines at block 712 may have an associated aligned virtual position that is a combination of the aligned virtual positions, determined from blocks 704-710, of the four virtual vane components forming the aligned virtual vane.

For at least some example embodiments, after identifying the aligned virtual vane at block 712, at block 714, the controller may perform a fine-tuning alignment on the aligned virtual to determine an updated aligned virtual vane. In particular, the controller may align the aligned virtual vane to the nominal virtual vane. Similar to block 704, the controller may perform an RPS alignment on the aligned virtual vane relative to the nominal virtual vane in order to determine the updated aligned virtual vane. The controller may perform the RPS alignment in one or more iterations, and with each iteration, the controller may perform the RPS alignment according to a different datum sequence of primary, secondary, and tertiary datums. In other example embodiments, the controller may skip the fine tuning at block 714, and proceed directly to block 716.

At block 716, the controller may identify which data points of the data set of the aligned virtual vane (updated aligned virtual vane if block 714 is performed) are throat window points for the (updated) aligned virtual vane. At block 718, the controller calculates a virtual throat area from the throat window points for the virtual combination. As mentioned, the virtual throat area may calculated in terms of units (e.g., thousands of inches) or in terms of a percentage, such as a percentage of, or a percent deviation from, a nominal value. The particular ways a controller determines the throat window points of a data set of a three-dimensional virtual vane at block 716, and calculates a virtual throat area at block 718, are known and outside the scope of the present description.

For at least some embodiments, practically, there is not enough available time for the controller to calculate virtual throat areas for all of the various possible combinations that might be available to the controller at a given point in time of a manufacturing method. For example, as mentioned, a vane stage including twenty vanes with a total eighty vane stage components may yield approximately 624,000 different possible virtual combinations of vanes that the controller can identify, and for which it can perform virtual alignments and calculate virtual throat areas. Even with present computing capabilities, performing virtual alignments and calculating virtual throat areas for such a larger number of possible combinations could taken an impracticable amount of time, such as on the order of months or even years. As mentioned, in various embodiments of block 602 of FIG. 6, the number of virtual combinations that the controller identifies may be less than all of the possible combinations in order to reduce the process time that the controller takes to calculate the virtual throat areas at block 604.

In various embodiments, the controller may calculate a first set of virtual throat areas for an initial set of virtual combinations of a plurality of virtual vane components, and then select a subset or a reduced number of virtual vane components from the plurality of virtual vane components based on the first set of virtual throat areas. Then, the controller may identify virtual combinations of the subset, and calculate virtual throat areas of those virtual combinations, such as according to the method 700 of FIG. 7. Doing so may reduce the number of virtual combinations for which the controller calculates virtual throat areas from hundreds of thousands to a reduced number in the low thousands, or to even a number under 1,000 or under 100.

Figure 8:
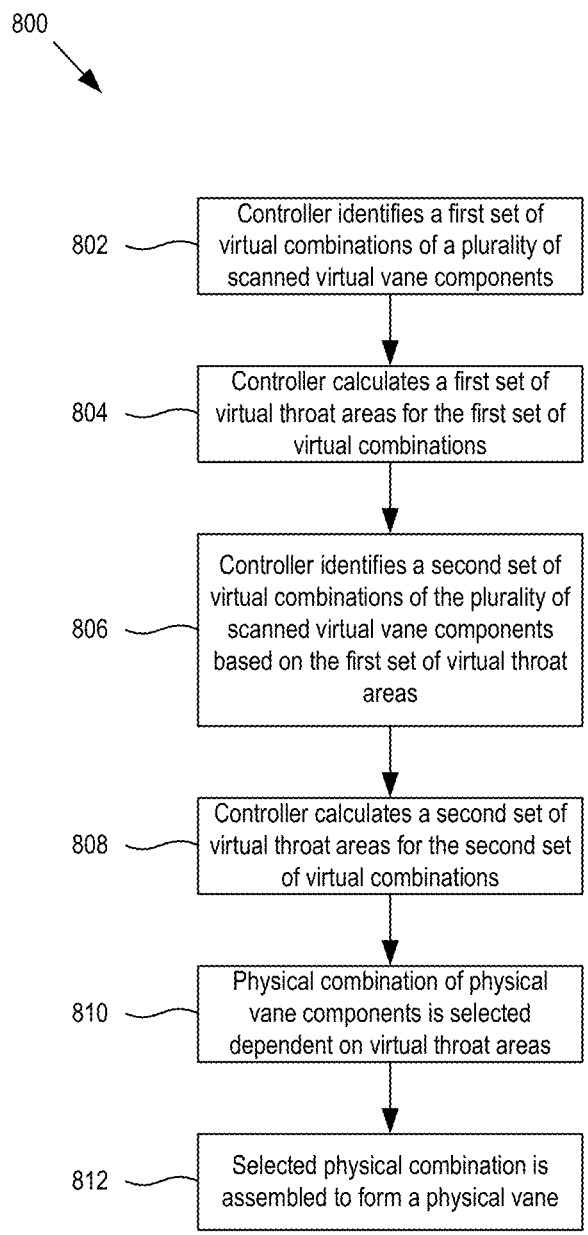
FIG. 8 is a flow chart of another example method for manufacturing a vane.

FIG. 8 is a flow chart of another example manufacturing method 800 for manufacturing a vane that includes an inner vane, an outer vane, a leading airfoil, and an outer airfoil. At block 802, the controller may identify a first set of virtual combinations of a plurality of scanned virtual vane components. For block 802, the scanned virtual vane components of a given virtual combination of the first set are all different from the scanned virtual vane components of the other virtual combinations of the first plurality. Otherwise stated, if the controller uses a given scanned virtual vane component for one virtual combination of the first set, it does not use that given scanned virtual vane component for any other virtual combination of the first set.

Upon identifying the first set of virtual combinations at block 804, the controller may then calculate a first set of virtual throat areas for each of the virtual combinations of the first set. For example, the controller may perform the method 700 on the first set of virtual combinations.

At block 806, the controller may determine a second set of virtual combinations of the plurality of virtual vane components based on the first set of calculated virtual throat areas. For at least some embodiments, the controller may determine an M-number of optimal virtual throat areas of an M-number of virtual combinations of the first set, and add those M-number of virtual combinations to the second set of virtual combinations.

In addition or alternatively, the controller may form at least one virtual combination for the second set based on a combination of two or more virtual combinations of the first set. The controller may select two or more virtual combinations from the first set, for a virtual combination of the second set, based on their associated virtual throat areas, with the expectation that "mix-and-matching" the virtual vane components of the multiple virtual combinations of the first set will yield one or more different virtual combinations with better virtual throat areas. For example, the controller may select a two virtual combination from the first set with associated virtual throat areas having opposite polarities of deviation from the nominal virtual throat area, with a first virtual throat area being higher than the nominal amount, and the second virtual throat area being lower than the nominal amount. The controller may then select one or more virtual vane components from the first virtual combination and one or more virtual vane components from the second virtual combination, to form a virtual combination for the second set. The expectation is that since one virtual throat area is higher than the nominal amount and the other virtual throat area is lower than the nominal amount, then forming one or more new virtual combinations from the original two virtual combinations would offset their individual higher and lower deviations, resulting in at least one new virtual combination for the second set that has a virtual throat area lower than the virtual throat areas of the original two virtual combinations.

In addition to selecting virtual combinations of the first set based on whether their calculated virtual throat areas are higher and lower, the controller may also select virtual combinations from the first set based on the degrees to which, or how much, their virtual throat areas are higher and lower. That is, the controller may select, for mix-and-matching, virtual combinations from the first set having virtual throat areas with opposite polarities but the same or similar magnitude deviations. To illustrate, when calculating virtual throat areas for the first set, suppose hypothetically that the controller calculates a first virtual throat area of a first virtual combination that is 5% greater than the nominal value, a second virtual throat area of a second virtual combination that is 1% less than the nominal value, and a third virtual throat area of a third virtual combination that is 4.5% less than the nominal value. In turn, the controller may determine to form a virtual combination of the second set based on the first virtual combination and the third virtual combination of the first set since they have virtual throat areas with opposite polarities of deviation and sufficiently close magnitudes of deviation. In addition, the controller may determine not to form a virtual combination for the second set based on the first and second virtual combinations of the first set since their magnitudes of deviations are not sufficiently close despite having opposite polarities of deviation. In addition, the controller may determine not to form a virtual combination for the second set based on the second and third virtual combinations since they have the same polarity of deviation.

Upon identifying the second set of virtual combinations, then at block 808, the controller may calculate a second set of virtual throat areas for the second set of virtual combinations. Similar to block 804, the controller may perform the method 700 on the second set of virtual combinations in order to calculate the second set of virtual throat areas.

At block 810, the manufacturing method 800 may transition to a physical selection process that selects a physical combination of physical vane components, as in block 606 of FIG. 6. Like block 606, the selection of the physical combination is dependent on the virtual throat areas calculated for the second set of virtual combinations at block 808. At block 812, the physical vane components of the selected physical combination are assembled together to form a physical vane. As with block 608, the physical vane assembled at block 812 has a physical throat area that is better, or at least has a much higher statistical likelihood of being better, than if the physical components are arbitrarily selected without performance of the virtual alignment and throat area calculations performed by the controller. Also, by performing virtual alignment and throat area calculations in two stages for two sets of virtual combinations, the controller not only reduces the number of virtual combinations from all of the possible combinations, but intelligently does so such that the virtual combinations of the second set and that are ultimately used to determine the physical combination are those virtual combinations having the best virtual throat areas.

Figure 9:
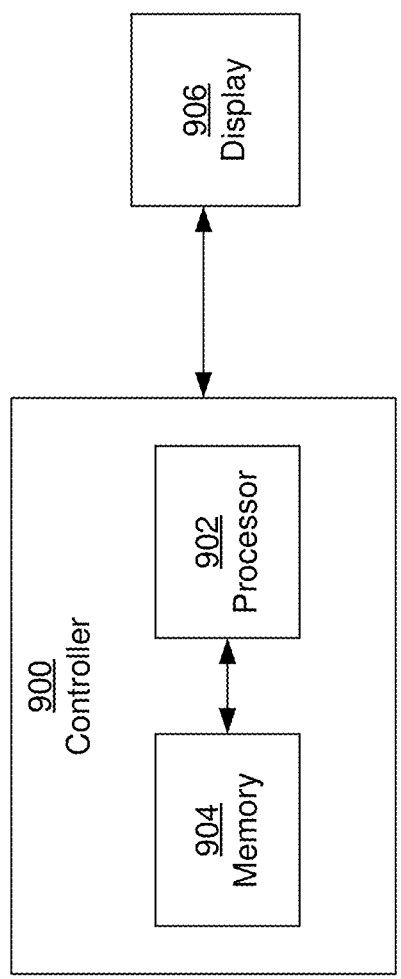
FIG. 9 is a block diagram of an example controller configured to perform at least some of the actions in the example methods of FIGS. 6-8.

FIG. 9 is a block diagram of an example controller 900 configured to carry out the actions or functions performed by the controller in the various embodiments of the methods 600, 700, 800 in FIGS. 6-8. In general, the controller 900 is an electronic device, such an electronic circuit, or system or network of electronic devices or electronic circuits, implemented in hardware or a combination of hardware and software. In the block diagram, the controller 900 includes a processor 902 and a memory 904. In general, the processor (or processor circuitry) 902 is a component of the controller 900, implemented in hardware alone, or as a combination of hardware and software, that is configured to perform the electronic functions described herein. In various embodiments where the controller 900 uses software to perform or carry out a given function, the function may have associated computer code or a set of computer instructions, stored in at least a portion of the memory 904. The processor 902 is configured, such as a microprocessor, a central processing unit (CPU), or the like, to access the memory 904 and execute the computer code/instructions in order to carry out the function. Also, in various embodiments the controller 900 may use hardware only, such as in the form of digital logic circuitry or the like, to perform a given function. Accordingly, in any of various embodiments, to perform the functions described herein, the processor 902 may use hardware circuitry only to perform functions, execute computer software code/instructions stored in the memory 904 to perform functions, or a combination thereof. In various embodiment, the controller 900 may be or include an integrated circuit (IC), an application specific integrated circuit (ASIC), a field programmable gate array (FPGA), a circuit, a digital logic circuit, an analog circuit, a combination of discrete circuits, gates, or any other type of hardware or combination thereof.

In addition, the memory 904 may be implemented according to any of various types of memory configured to store electronic data, including volatile memory, non-volatile memory, combinations therefore, or any other types of memory configured to store data, such in the form of digital bits of information. As mentioned, the memory 904 may store computer code or instructions that the processor 902 is configured to execute in order to carry out one or more of the functions described herein. For example, in various embodiment, the memory 904 may store computer-implemented algorithms, such as the alignment and local best fit algorithms described herein. As another example, the memory 904 stores software that the processor 902 executes to establish a virtual workspace and virtually move data, such as scan mesh data, in the virtual workspace. In addition or alternatively, the memory 904 is configured to store data on which the controller 900 performs the functions, including the data sets of the scanned and nominal virtual vanes and virtual vane components, and virtual positions of the virtual vane and vane components. For example, when machined physical vane component are three-dimensionally scanned, their scanned virtual vane component counterparts are stored in the memory 904, which the processor 902 then access to perform the various functions described herein.

Also, in various embodiments, the controller 900 may be, or may be a component of, an electronic device operable by a user, such as a desktop computer, a laptop computer, a smartphone, a tablet computer, a server, or a network of such devices interconnected together through using any of various forms of wired and/or wireless connections, as non-limiting examples. Accordingly, in various embodiments, the processor 902 may be configured locally with the memory 904. In other embodiments, the memory 904 may be configured remotely from the processor 902, such as part of a remote server for example, and the processor 902 may be configured to communicate with the memory 904 over a network, such as the Internet or WiFi for example, in order to access data stored in the memory 904.

Also, in various embodiment, the controller 900 may be electronically coupled to, or in some embodiments include, an electronic display, configured to display any of various electronic information, non-limiting examples of which include a liquid crystal display (LCD), a light emitting diode (LED) display, a touchscreen display on a mobile device, or any other of various types of electronic displays. Through the display 906, the controller 900 may be configured to display, to a user, the three-dimensional virtual representations of the scanned and/or nominal virtual vanes in any of various virtual positions in a virtual workspace, alone or combined together in any of various virtual combinations. Additionally, through the display 906, the controller 900 may graphically illustrate, in the one or more of the virtual components virtually move, such as in accordance with any of various six-degrees of freedom. In addition or alternatively, through the display 906, the controller 900 may be configured to display calculated virtual throat areas of any of various virtual combinations, or statuses of any of the various stages of the methods described herein, such as when a given alignment is starting or has been completed, as non-limiting examples.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

1. A gas turbine engine manufacturing method comprising:
   identifying, with a controller, a plurality of virtual combinations of a plurality of scanned virtual vane components, each scanned virtual vane component comprising a respective first data set that indicates a three-dimensional virtual representation of a different one of a plurality of physical vane components manufactured and three-dimensionally scanned to generate the scanned virtual vane components;
   determining, with the controller, a plurality of virtual throat areas for the plurality of virtual combinations, wherein determining the plurality of virtual throat areas comprises, for each combination:
      virtually aligning, with the controller, mating surfaces of scanned virtual vane components of a respective virtual combination;
      in response to the virtually aligning, determining, with the controller, an aligned virtual vane corresponding to the respective virtual combination, the aligned virtual vane comprising a second data set indicating a three-dimensional virtual representation of a different one of a plurality of physical combinations of the physical vane components; and
      calculating, with the controller, a respective virtual throat area of the aligned virtual vane;
   selecting a physical combination of physical vane components of the plurality of physical vane components, the selection dependent on an optimal virtual combination having an optimal virtual throat area from among the plurality of virtual throat areas, wherein the physical combination corresponds to the optimal virtual combination; and
   assembling together physical vane components of the selected physical combination to form a vane of a gas turbine engine having an optimal physical throat area.

2. The method of aspect 1, wherein virtually aligning the mating surfaces of the scanned virtual vane components of the respective virtual combination comprises: virtually aligning inner mating surfaces of a pair of scanned virtual airfoils to a pair of mating surfaces of a scanned virtual inner endwall.

3. The method of aspect 2, wherein virtually aligning the inner mating surfaces of the pair of scanned virtual airfoils to the pair of mating surfaces of the scanned virtual inner endwall comprises executing, with the controller, a pair of local best fit algorithms according to a movement constraint.

4. The method of aspect 3, wherein virtually aligning the inner mating surfaces of the pair of scanned virtual airfoils to the pair of mating surfaces of the scanned virtual inner endwall comprises highlighting data points of the inner mating surfaces and the pair of mating surfaces in order to execute the pair of local best fit algorithms on the inner mating surfaces and the pair of mating surfaces only, without remaining portions of the scanned virtual inner endwall and the pair of scanned virtual airfoils.

5. The method of any of aspects 2 to 4, further comprising: before virtually aligning the inner mating surfaces of the pair of scanned virtual airfoils to the pair of mating surfaces of the scanned virtual inner endwall, virtually aligning, with the controller, the scanned virtual inner endwall to a nominal virtual inner endwall to determine an aligned virtual position of the scanned virtual inner endwall.

6. The method of aspect 5, wherein virtually aligning the scanned virtual inner endwall to the nominal virtual inner endwall comprises executing, with the controller, a local best fit algorithm, the method further comprising: after executing the local best fit algorithm, performing, with the controller, a relative point system alignment between the scanned virtual inner endwall and datums of the nominal virtual endwall.

7. The method of aspect 6, wherein performing the relative point system alignment comprises performing the relative point system alignment over a plurality of iterations, each iteration according to a different one of a plurality of datum sequences.

8. The method of any of aspects 5 to 7, wherein virtually aligning the inner mating surfaces of the pair of scanned virtual airfoils to the pair of mating surfaces of the scanned virtual inner endwall comprises virtually aligning the inner mating surfaces to the pair of mating surfaces with the scanned virtual inner endwall fixed in the aligned virtual position.

9. The method of any of aspects 2 to 8, further comprising: before virtually aligning the inner mating surfaces of the pair of scanned virtual airfoils to the pair of mating surfaces of the scanned virtual inner endwall, virtually aligning, with the controller, the pair of scanned virtual airfoils to respective nominal virtual airfoils.

10. The method of any of aspects 2 to 9, further comprising: after virtually aligning the inner mating surfaces of the pair of scanned virtual airfoils to the pair of mating surfaces of the scanned virtual inner endwall, virtually aligning, with the controller, outer mating surfaces of the pair of scanned virtual airfoils to a pair of mating surfaces of a scanned virtual outer endwall.

11. The method of aspect 10, wherein virtually aligning the outer mating surfaces of the scanned virtual inner endwall to the pair of mating surfaces of the scanned virtual outer endwall comprises: executing, with the controller, a pair of local best fit algorithms according to a movement constraint.

12. The method of aspect 11, wherein the movement constraint comprises a first movement constraint that is larger than a second movement constraint according to which a second pair of local best fit algorithms are executed to virtually align the inner mating surfaces of the pair of scanned virtual airfoils to the pair of mating surfaces of the scanned virtual inner endwall.

13. The method of aspect 12, wherein the first movement constraint is in a range of about 1.5 to about 2.5 times larger than the second movement constraint.

14. The method of any of aspects 10 to 13, further comprising: determining, with the controller, aligned virtual positions of the pair of scanned virtual airfoils in response to virtually aligning the mating surfaces of the pair of scanned virtual airfoils to the pair of mating surfaces of the scanned virtual inner endwall; and updating, with the controller, the aligned virtual positions of the pair of scanned virtual airfoils in response to virtually aligning the outer mating surfaces of the scanned virtual endwall to the pair of mating surfaces of the scanned virtual outer endwall.

15. The method of any of aspects 10 to 14, wherein determining the aligned virtual vane corresponding to the respective virtual combination comprises determining, with the controller, the aligned virtual vane in response to completing virtually aligning the outer mating surfaces of the pair of scanned virtual airfoils to the pair of mating surfaces of the scanned virtual outer endwall.

16. The method of any of aspects 10 to 14, further comprising: determining, with the controller, an initially aligned virtual vane corresponding to the respective virtual combination in response to completing virtually aligning the outer mating surfaces of the pair of scanned virtual airfoils to the pair of mating surfaces of the scanned virtual outer endwall; and performing, with the controller, a relative point system alignment between the initially aligned virtual vane and datums of a nominal virtual vane to determine the aligned virtual vane.

17. The method of any of aspects 1 to 16, wherein the plurality of virtual combinations comprises less than all possible virtual combinations of the plurality of scanned virtual vane components.

18. The method of any of aspects 1 to 17, wherein the plurality of virtual combinations comprises a second set of virtual combinations of the plurality of scanned virtual vane components, and the plurality of virtual throat areas comprises a second set of virtual throat areas, the method further comprising: identifying, with the controller, a first set of virtual combinations of the plurality of scanned virtual vane components; determining, with the controller, a first set of virtual throat areas for the first set of virtual combinations; and identifying, with the controller, the second set of virtual combinations based on the first set of virtual throat areas.

19. The method of aspect 18, wherein identifying the second set of virtual combinations comprises: identifying, with the controller, an M-number of virtual combinations comprising an M-number of best virtual throat areas in the first set of virtual throat areas.

20. The method of aspect 18 or 19, wherein identifying the second set of virtual combinations comprises: selecting, with the controller, a first virtual combination and a second virtual combination from the first set, the selecting dependent on the first virtual combination and the second virtual combination comprising respective virtual throat areas having opposite polarities of deviation from a nominal throat area; and forming, with the controller, a virtual combination of the second set by combining one or more virtual vane components of the first virtual combination with one or more vane components of the second virtual combination.

What is claimed is:

1. A gas turbine engine manufacturing method comprising:
   identifying, with a controller, a plurality of virtual combinations of a plurality of scanned virtual vane components, each scanned virtual vane component comprising a respective first data set that indicates a respective first three-dimensional virtual representation of a first different one of a plurality of physical vane components manufactured and three-dimensionally scanned to generate the plurality of scanned virtual vane components;
   determining, with the controller, a plurality of virtual throat areas for the plurality of virtual combinations, wherein determining the plurality of virtual throat areas comprises, for each combination:
      virtually aligning, with the controller, mating surfaces of scanned virtual a respective virtual combination, the virtually aligning comprising virtually aligning inner mating surfaces of a pair of scanned virtual airfoils to a pair of mating surfaces of a scanned virtual inner endwall by highlighting data points of the inner mating surfaces and the pair of mating surfaces in order to execute a pair of local best fit algorithms according to a movement constraint on the inner mating surfaces and the pair of mating surfaces only, without remaining portions of the scanned virtual inner endwall and the pair of scanned virtual airfoils;
      in response to the virtually aligning, determining, with the controller, an aligned virtual vane corresponding to the respective virtual combination, the aligned virtual vane comprising a second data set indicating a second three-dimensional virtual representation of a second different one of a plurality of physical combinations of the plurality of physical vane components; and
      calculating, with the controller, a respective virtual throat area of the aligned virtual vane;
   selecting a physical combination of a set of physical vane components of the plurality of physical vane components, the selection dependent on an optimal virtual combination having an optimal virtual throat area from among the plurality of virtual throat areas, wherein the physical combination corresponds to the optimal virtual combination; and
   assembling together the set of physical vane components of the selected physical combination to form a vane of a gas turbine engine having an optimal physical throat area.

2. The method of claim 1, further comprising: before the virtually aligning the inner mating surfaces of the pair of scanned virtual airfoils to the pair of mating surfaces of the scanned virtual inner endwall, virtually aligning, with the controller, the scanned virtual inner endwall to a nominal virtual inner endwall to determine an aligned virtual position of the scanned virtual inner endwall.

3. The method of claim 2, wherein the virtually aligning the scanned virtual inner endwall to the nominal virtual inner endwall comprises executing, with the controller, another local best fit algorithm, the method further comprising: after executing the another local best fit algorithm, performing, with the controller, a relative point system alignment between the scanned virtual inner endwall and datums of the nominal virtual inner endwall.

4. The method of claim 3, wherein performing the relative point system alignment comprises performing the relative point system alignment over a plurality of iterations, each iteration according to a different one of a plurality of datum sequences.

5. The method of claim 2, wherein the virtually aligning the inner mating surfaces of the pair of scanned virtual airfoils to the pair of mating surfaces of the scanned virtual inner endwall comprises virtually aligning the inner mating surfaces to the pair of mating surfaces with the scanned virtual inner endwall fixed in the aligned virtual position.

6. The method of claim 1, further comprising: before the virtually aligning the inner mating surfaces of the pair of scanned virtual airfoils to the pair of mating surfaces of the scanned virtual inner endwall, virtually aligning, with the controller, the pair of scanned virtual airfoils to respective nominal virtual airfoils.

7. The method of claim 1, further comprising: wherein the pair of mating surfaces of the scanned virtual inner endwall are a pair of inner mating surfaces of the scanned virtual inner endwall,
after the virtually aligning the inner mating surfaces of the pair of scanned virtual airfoils to the pair of inner mating surfaces of the scanned virtual inner endwall,
virtually aligning, with the controller, outer mating surfaces of the pair of scanned virtual airfoils to a pair of outer mating surfaces of a scanned virtual outer endwall.

8. The method of claim 7, wherein the virtually aligning the outer mating surfaces of the pair of scanned virtual to the pair of outer mating surfaces of the scanned virtual outer endwall comprises: executing, with the controller, the pair of local best fit algorithms according to the movement constraint.

9. The method of claim 8, wherein the movement constraint comprises a first movement constraint that is larger than a second movement constraint according to which a second pair of local best fit algorithms are executed to virtually align the inner mating surfaces of the pair of scanned virtual airfoils to the pair of mating surfaces of the scanned virtual inner endwall.

10. The method of claim 9, wherein the first movement constraint is in a range of 1.5 to 2.5 times larger than the second movement constraint.

11. The method of claim 7, further comprising:
determining, with the controller, aligned virtual positions of the pair of scanned virtual airfoils in response to the virtually aligning the mating surfaces of the pair of scanned virtual airfoils to the pair of inner mating surfaces of the scanned virtual inner endwall; and
updating, with the controller, the aligned virtual positions of the pair of scanned virtual airfoils in response to the virtually aligning the outer mating surfaces of the pair of scanned virtual airfoils to the pair of outer mating surfaces of the scanned virtual outer endwall.

12. The method of claim 7, wherein determining the aligned virtual vane corresponding to the respective virtual combination comprises determining, with the controller, the aligned virtual vane in response to completing the virtually aligning the outer mating surfaces of the pair of scanned virtual airfoils to the pair of outer mating surfaces of the scanned virtual outer endwall.

13. The method of claim 7, further comprising:
virtual vane and datums of a nominal virtual vane to determine the aligned virtual determining, with the controller, an initially aligned virtual vane corresponding to the respective virtual combination in response to completing the virtually aligning the outer mating surfaces of the pair of scanned virtual airfoils to the pair of outer mating surfaces of the scanned virtual outer endwall; and
performing, with the controller, a relative point system alignment between the initially aligned vane.

14. The method of claim 1, wherein the plurality of virtual combinations comprises less than all possible virtual combinations of the plurality of scanned virtual vane components.

15. The method of claim 1, wherein the plurality of virtual combinations comprises a second set of virtual combinations of the plurality of scanned virtual vane components, and the plurality of virtual throat areas comprises a second set of virtual throat areas, the method further comprising:
identifying, with the controller, a first set of virtual combinations of the plurality of scanned virtual vane components;
determining, with the controller, a first set of virtual throat areas for the first set of virtual combinations; and
identifying, with the controller, the second set of virtual combinations based on the first set of virtual throat areas.

16. The method of claim 15, wherein identifying the second set of virtual combinations comprises: identifying, with the controller, an M-number of virtual combinations comprising an M-number of best virtual throat areas in the first set of virtual throat areas.

17. The method of claim 15, wherein identifying the second set of virtual combinations comprises:
selecting, with the controller, a first virtual combination and a second virtual combination from the first set of virtual combinations, the selecting dependent on the first virtual combination and the second virtual combination comprising respective virtual throat areas having opposite polarities of deviation from a nominal throat area; and
forming, with the controller, a virtual combination of the second set of virtual combinations by combining one or more virtual vane components of the first virtual combination with one or more vane components of the second virtual combination.

18. A gas turbine engine manufacturing method comprising:
identifying, with a controller, a plurality of virtual combinations of a plurality of scanned virtual vane components, each scanned virtual vane component comprising a respective first data set that indicates a first three-dimensional virtual representation of a different one of a plurality of physical vane components manufactured and three-dimensionally scanned to generate the plurality of scanned virtual vane components;

determining, with the controller, a plurality of virtual throat areas for the plurality of virtual combinations, wherein determining the plurality of virtual throat areas comprises, for each combination:
  virtually aligning, with the controller, mating surfaces of respective scanned virtual vane components of a respective virtual combination, wherein the virtual aligning comprises: virtually aligning inner mating surfaces of a pair of scanned virtual airfoils to a pair of inner mating surfaces of a scanned virtual inner endwall, and virtually aligning outer mating surfaces of the pair of scanned virtual airfoils to a pair of outer mating surfaces of a scanned virtual outer endwall;
  determining, with the controller, aligned virtual positions of the pair of scanned virtual airfoils in response to the virtually aligning the inner mating surfaces of the pair of scanned virtual airfoils to the pair of inner mating surfaces of the scanned virtual inner endwall;
  updating, with the controller, the aligned virtual positions of the pair of scanned virtual airfoils in response to the virtually aligning the outer mating surfaces of the pair of scanned virtual airfoils to the pair of outer mating surfaces of the scanned virtual outer endwall;
  in response to the virtually aligning the mating surfaces of the respective scanned virtual vane components of the respective virtual combination, determining, with the controller, an aligned virtual vane corresponding to the respective virtual combination, the aligned virtual vane comprising a second data set indicating a second three-dimensional virtual representation of a different one of a plurality of physical combinations of the plurality of physical vane components; and
  calculating, with the controller, a respective virtual throat area of the aligned virtual vane;
selecting a physical combination of physical vane components of the plurality of physical vane components, the selection dependent on an optimal virtual combination having an optimal virtual throat area from among the plurality of virtual throat areas, wherein the physical combination corresponds to the optimal virtual combination; and
assembling together the physical vane components of the selected physical combination to form a vane of a gas turbine engine having an optimal physical throat area.

19. A gas turbine engine manufacturing method comprising:
identifying, with a controller, a plurality of virtual combinations of a plurality of scanned virtual vane components, each scanned virtual vane component comprising a respective first data set that indicates a first three-dimensional virtual representation of a different one of a plurality of physical vane components manufactured and three-dimensionally scanned to generate the plurality of scanned virtual vane components;
determining, with the controller, a plurality of virtual throat areas for the plurality of virtual combinations, wherein determining the plurality of virtual throat areas comprises, for each combination:
  virtually aligning, with the controller, mating surfaces of respective scanned virtual vane components of a respective virtual combination, wherein the virtual aligning comprises: virtually aligning inner mating surfaces of a pair of scanned virtual airfoils to a pair of inner mating surfaces of a scanned virtual inner endwall, and virtually aligning outer mating surfaces of the pair of scanned virtual airfoils to a pair of outer mating surfaces of a scanned virtual outer endwall;
  determining, with the controller, an initially aligned virtual vane corresponding to the respective virtual combination in response to completing the virtually aligning the outer mating surfaces of the pair of scanned virtual airfoils to the pair of outer mating surfaces of the scanned virtual outer endwall;
  in response to the virtually aligning the mating surfaces of the respective scanned virtual vane components of the respective virtual combination, determining, with the controller, an aligned virtual vane corresponding to the respective virtual combination, the aligned virtual vane comprising a second data set indicating a second three-dimensional virtual representation of a different one of a plurality of physical combinations of the physical vane components of the plurality of physical vane components, wherein determining the aligned virtual vane comprises performing a relative point system alignment between the initially aligned virtual vane and datums of a nominal virtual vane; and
  calculating, with the controller, a respective virtual throat area of the aligned virtual vane;
selecting a physical combination of physical vane components of the plurality of physical vane components, the selection dependent on an optimal virtual combination having an optimal virtual throat area from among the plurality of virtual throat areas, wherein the physical combination corresponds to the optimal virtual combination; and
assembling together the physical vane components of the selected physical combination to form a vane of a gas turbine engine having an optimal physical throat area.

* * * * *